(12) United States Patent
Faure

(10) Patent No.: US 7,226,509 B2
(45) Date of Patent: Jun. 5, 2007

(54) METHOD FOR FABRICATING A CARRIER SUBSTRATE

(75) Inventor: Bruce Faure, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 245 days.

(21) Appl. No.: 10/716,901

(22) Filed: Nov. 18, 2003

(65) Prior Publication Data

US 2004/0255846 A1    Dec. 23, 2004

(30) Foreign Application Priority Data

Jun. 6, 2003    (EP) .................................. 03291371

(51) Int. Cl.
C30B 25/02    (2006.01)
(52) U.S. Cl. .............................. 117/95; 117/89; 117/94; 117/96; 117/915
(58) Field of Classification Search ................. 117/89, 117/94, 95, 96, 915
See application file for complete search history.

(56) References Cited

U.S. PATENT DOCUMENTS

| | | | | |
|---|---|---|---|---|
| 5,374,564 A | 12/1994 | Bruel | .......................... | 437/24 |
| 5,714,395 A | 2/1998 | Bruel | .......................... | 437/24 |
| 5,759,898 A | 6/1998 | Ek et al. | ...................... | 438/291 |
| 6,051,849 A | 4/2000 | Davis et al. | ................. | 257/103 |
| 6,086,673 A | 7/2000 | Molnarq | ..................... | 117/102 |
| 6,113,685 A | 9/2000 | Wang et al. | .................... | 117/3 |
| 6,120,597 A * | 9/2000 | Levy et al. | ..................... | 117/3 |
| 6,146,457 A | 11/2000 | Solomon | ...................... | 117/90 |
| 6,150,239 A * | 11/2000 | Goesele et al. | ............. | 438/458 |
| 6,280,523 B1 * | 8/2001 | Coman et al. | .............. | 117/101 |
| 6,303,405 B1 | 10/2001 | Yoshida et al. | ............... | 438/46 |
| 6,440,823 B1 | 8/2002 | Vaudo et al. | ................. | 438/478 |
| 6,478,871 B1 | 11/2002 | Shealy et al. | ................. | 117/84 |
| 6,540,827 B1 * | 4/2003 | Levy et al. | .................... | 117/3 |
| 6,677,249 B2 * | 1/2004 | Laermer et al. | ............ | 438/745 |
| 6,923,859 B2 * | 8/2005 | Kim | ............................ | 117/85 |
| 6,958,093 B2 * | 10/2005 | Vaudo et al. | ................. | 117/90 |
| 6,972,051 B2 * | 12/2005 | Tischler et al. | ............... | 117/97 |

(Continued)

FOREIGN PATENT DOCUMENTS

EP    0 382 341    8/1990

(Continued)

OTHER PUBLICATIONS

R. Lantier et al., "Influence of the first preparation steps on the properties of GaN layers grown on 6H-SIC by MBE", , MRS Internet J. Nitride Semicond. Res. 4S1, G3.50 (1999).

(Continued)

*Primary Examiner*—Robert Kunemund
(74) *Attorney, Agent, or Firm*—Winston & Strawn LLP

(57) ABSTRACT

A method for fabricating a carrier substrate. The technique includes providing a crystalline or mono-crystalline base substrate, growing a stiffening layer on a front face of the base substrate at a thickness sufficient to form a carrier substrate for subsequent processing, and detaching the stiffening layer from the base substrate to obtain the carrier substrate and a remainder of the base substrate. The carrier substrate is suitable for use in growing high quality homo-epitaxial or hetero-epitaxial films thereon.

28 Claims, 1 Drawing Sheet

U.S. PATENT DOCUMENTS

| | | | |
|---|---|---|---|
| 2002/0011599 A1 | 1/2002 | Motoki et al. | 257/76 |
| 2002/0068201 A1 | 6/2002 | Vaudo et al. | 428/704 |

FOREIGN PATENT DOCUMENTS

| | | |
|---|---|---|
| EP | 1 298 234 A2 | 4/2002 |
| EP | 1 361 298 A1 | 11/2003 |
| FR | 2 681 472 | 3/1993 |
| FR | 2 774 511 | 8/1999 |
| FR | 2 810 159 A1 | 12/2001 |
| JP | 2002343718 | 11/2002 |
| WO | WO 99/39377 | 5/1999 |
| WO | WO 02/064865 A1 | 8/2002 |
| WO | WO 03/043066 A2 | 5/2003 |

OTHER PUBLICATIONS

J. Cao et al, "Improved quality GaN by growth on compliant silicon-on-insulator substrates using metalorganic chemical vapor deposition", , Journal of Applied Physics, vol. 83, No. 7, (1998).

Jyh-Rong Gong et al., "Influence of AlN/GaN strained multi-layers on threading dislocations in GaN films grown by alternate supply of metalorganics and $NH_3$", Materials Science and Engineering B94 pp. 155-158 (2002).

Motoaki Iwaya et al., "Realization of crack-free and high-quality thick $Al_xGa_{1-x}N$ for UV optoelectronics using low-temperature interlayer", Applied Surface Science vol. 159-160 pp. 405-413 (2000).

H. Amano et al., "Metalorganic vapor phase epitaxial growth of a high quality GaN film using an AlN buffer layer", Applied Physics Letters, vol. 48, No. 5, pp. 353-355 (1986).

Y. Ujiie et al., "Epitaxial lateral overgrowth of GaAs on a Si substrate", Japanese Journal of Applied-Physics, vol. 28, No. 3; pp. L337-L339 (1989).

B. Beaumont, Ph. et al., "Epitaxial lateral overgrowth of GaN", phys. stat. sol. (b) 227, No. 1, 1-43 (2001).

* cited by examiner

METHOD FOR FABRICATING A CARRIER SUBSTRATE

BACKGROUND ART

The invention relates to a method of fabricating a carrier substrate which is suitable for fabricating good quality homo- or heteroepitaxial films or layers.

Epitaxy is a process during which a crystalline layer of a material is deposited on a substrate, which is also crystalline. Epitaxial growth is characterized by having the crystalline structure of the substrate reproduced in the epitaxial layer of the material that is grown. Consequently, the defects present in the substrate are usually reproduced in the epitaxial layer. Epitaxial layers are typically used in electronic or optoelectronic applications. Of particular interest are, for example, gallium nitride epitaxial layers which, due to their large band gap, are used in blue, violet or ultraviolet laser diodes.

Epitaxial techniques can be essentially grouped into two families. First, there is homoepitaxy, wherein the material to be grown is of the same nature as the substrate. This means that the crystallographic structure and the chemical nature of the substrate and the resulting layer are essentially identical. Typical examples used in industry are the homoepitaxy of silicon on a silicon substrate, or the epitaxial growth of gallium arsenide on a substrate of gallium arsenide.

Of even greater interest is heteroepitaxy, wherein a film layer is grown on a substrate of a different nature. This is especially important where the desired material is not available in the form of a crystalline substrate. There are two major problems inherent with heteroepitaxy: the difference in the crystalline structure of the two materials, and the difference in their thermal expansion coefficients. These differences lead to stress inside the film and consequently to defects such as dislocations.

In addition to the above-mentioned problems that result in insufficient epitaxial layer quality, it is also possible that the substrate, due to its intrinsic characteristics, is not suitable for a particular device application that would use the special characteristics of the epitaxial layer. For example, when growing gallium nitride on silicon carbide relatively good epitaxial growth could be achieved. However, if the gallium nitride structure is intended for fabrication of a light-emitting device, the silicon carbide substrate would not be advantageous, as it would trap too much light.

Several approaches are known for overcoming the above-mentioned problems. However, none proposes a substrate which allows homo- as well as heteroepitaxial growth and overcomes each of the three distinct problems mentioned above. For example U.S. Pat. No. 5,759,898 discloses that it is possible to successfully grow an epitaxial silicon germanium thin film on a silicon-on-insulator wafer. In this case, the silicon germanium layer grows on a thin silicon film (about 16 nm), which itself is positioned on a layer of silicon dioxide, which is in turn positioned on a silicon wafer. In such a structure, the appearance of dislocations in the silicon germanium film is greatly diminished in comparison to a silicon germanium film directly grown on a bulk silicon substrate.

Another approach is described in International Publication WO 99/39377, wherein a "compliant" substrate is created by ion implantation. In this approach, ion implantation is used to obtain a weakened layer inside the material, which also creates a very thin layer on the top. This top layer is partially isolated from the substrate via the weakened layer, and to some extent absorbs the crystalline structure and thermal expansion mismatch between the top layer of the original substrate and the epitaxial layer to be grown, thereby causing at least a partial relaxation of the stress of the epitaxial layer.

These two approaches overcome to some extent the above-mentioned problems. However, the presence of the original substrate imposes a negative influence that is not excluded. In some cases the presence of the original substrate is incompatible with the desired application of the epitaxial layer that is grown, so that further processing steps are needed to remove the original substrate, which leads to higher production costs. Thus, improvements in these products and the processes of making them are desired.

SUMMARY OF THE INVENTION

The present invention relates to a method for fabricating a carrier substrate that includes providing a crystalline or mono-crystalline base substrate, growing a stiffening layer on a front face of the base substrate at a thickness sufficient to form a carrier substrate for subsequent processing, and detaching the stiffening layer from the base substrate to obtain the carrier substrate and a remainder of the base substrate. The carrier substrate is suitable for use in growing high quality homo-epitaxial or hetero-epitaxial films thereon. The carrier substrate is therefore sufficiently robust to withstand detachment from the remainder of the base substrate, and/or sufficiently stable that it can be detached from the remainder of the substrate by appropriate means, for example, in order to place it in a different apparatus for further processing.

In an advantageous embodiment, the front face of the base substrate is detached with the stiffening layer to form a sub-layer of the carrier substrate. The technique may beneficially include implanting atomic species into a front face of the base substrate to a controlled mean implantation depth to form a zone of weakness within the base substrate that defines the sub-layer. This is a very elegant way of defining the area where, in a later processing step, detachment takes place between the carrier substrate and the remainder of the base substrate. The atomic species may be at least one of hydrogen ions and rare gas.

In a preferred embodiment, the implanting step occurs before growing the stiffening layer. It is known that during ion implantation the implanted ions do not only disturb the crystalline structure on the desired level inside the substrate, but that defects are also introduced into the layer through which the ions travel. This means that if ion implantation were to take place after providing the stiffening layer, the stiffening layer would contain defects that might influence the quality of the epitaxial layer to be grown. Therefore, it is advantageous to perform ion implantation first and then the growth of the stiffening layer.

In an advantageous implementation of the invention, the sub-layer is less than approximately 5 µm thick, preferably less than 2 µm thick and more preferably less than 1 µm thick. Choosing a relatively thick sub-layer has the advantage that the thickness of the stiffening layer can be relatively small, thereby speeding up the process. However, choosing a relatively thin sub-layer results in minimizing any undesirable properties of the sub-layer material, for example, poor light absorbent properties for optical applications. Thickness control of the sub-layer can easily be managed by adjusting the energy of the ions.

A thermal treatment may beneficially be used to detach the carrier substrate from the base substrate. Due to the thermal treatment, the weakened zone inside the base substrate is further weakened, which leads to a rupture between the remainder of the base substrate and the stiffening layer together with the sub-layer. Thermal treatments are generally easy to implement and to control. If necessary, a mechanical treatment can be applied to attain the final detachment.

In another advantageous implementation according to the invention, a sacrificial layer is provided on the front face of the base substrate prior to implanting atomic species. The sacrificial layer may be a thin silicon dioxide ($SiO_2$) layer. In an embodiment, the sacrificial layer is removed before providing the stiffening layer. The sacrificial layer helps to protect the substrate surface from typical organic and particle contamination, which can occur during high-energy ion implantation. In addition, when a sacrificial layer is used, any contamination is fixed on this layer, and subsequent removal of the sacrificial layer also removes the contamination. Furthermore, the crystallographic properties or the thermal expansion coefficient of the sacrificial layer might not be suitable for growing the desired stiffening layer or epitaxial layer.

In a preferred embodiment, the stiffening layer is grown by at least one of epitaxial growth, molecular beam epitaxy (MBE), metal-organic chemical vapor deposition (MOCVD), hydride vapor phase epitaxy (HVPE) or by sputtering. In addition, the stiffening layer may be in the range of approximately 5 µm to at least approximately 10 µm thick. Such a thickness of the stiffening layer together with that of the sub-layer provides sufficient stability to the carrier substrate so that its surface does not become deformed or destroyed when detached from the base substrate.

In another advantageous implementation of the invention, the surface of the base substrate is pre-treated prior to growing the stiffening layer by using at least one of HF etching, plasma etching, or a standard cleaning treatment. Such pre-treatments improve the quality of the stiffening layer.

In a variation, at least one additional layer is provided on top of the stiffening layer or between the base substrate and the stiffening layer. The additional layer between the base substrate and a stiffening layer may be a buffer layer, the buffer layer being made of at least one of AlN, GaN, AlGaN or a combination thereof. Such layers are helpful in overcoming the residual differences in crystallographic structure and thermal expansion. Therefore, by applying these kinds of additional layers, residual stresses can be further diminished, leading to improved epitaxial films. These materials can also be arranged in the form of several layers.

In yet another beneficial implementation, at least two additional layers are provided on top of the base substrate, wherein at least one of the additional layers is provided prior to implanting atomic species. In addition, the atomic species may be implanted into the at least one additional layer to create a weakened zone inside the at least one additional layer. This means that after the detachment step, no material from the original substrate is present and thus the residual stress can be further diminished, resulting in improved epitaxial films. In this case, the remainder of the base substrate is made of the entire base substrate itself and the part of the at least one additional layer situated between the weakened zone and the base substrate.

In a variation according to the invention, a surface of the remainder of the base substrate is polished after detaching the carrier substrate such that the base substrate is suitable for reuse. This permits a non-negligible amount of high quality carrier substrates to be manufactured from a relatively expensive mono-crystalline base substrate. The base substrate may be made of at least one of silicon, silicon carbide, sapphire, gallium arsenide, indium phosphide (InP) or germanium (Ge). For epitaxial growth, these substrates are usually mono-crystalline and can present surfaces of various crystalline directions. These substrates are readily available and because their properties vary, they form a good base for growing a large number of different carrier substrates, thereby permitting the growth of an even larger amount of epitaxial layers with good crystalline properties.

BRIEF DESCRIPTION OF THE DRAWINGS

Other aspects, purposes and advantages of the invention will become clear after reading the following detailed description with reference to the attached drawings, in which:

FIG. 1d' schematically shows a detaching step between the base substrate and the carrier substrate according to an alternate embodiment of the invention.

DETAILED DESCRIPTION OF THE PREFERRED EMBODIMENTS

Figure 1:
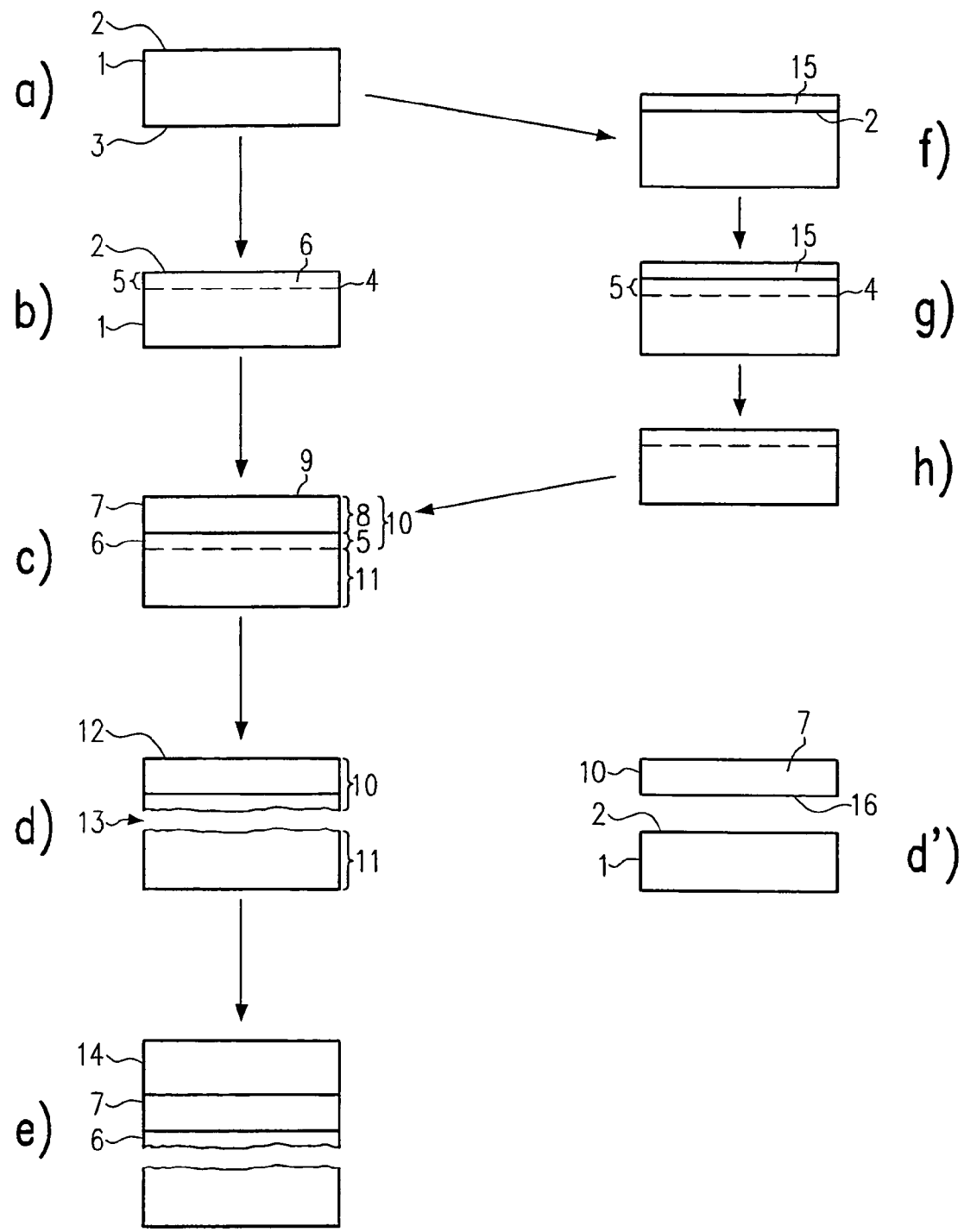
FIGS. 1a to 1e schematically show the method of preparing a carrier substrate according to the present invention, which may be used to fabricate a homo- or heteroepitaxial film.
FIGS. 1f to 1h schematically show a second embodiment according to the present invention which includes additional processing steps.

In a preferred embodiment, the stiffening layer is epitaxially grown and is made of the same material as an epitaxial film to be grown on the carrier substrate in a subsequent fabricating step. This means that between the epitaxial film and the carrier substrate there is nearly no difference in crystalline structure and thermal expansion coefficients, resulting in high quality epitaxial films. When the difference in crystalline structure or thermal expansion coefficient of the base substrate and the desired epitaxial film would be too great, it is advantageous to choose a stiffening layer of a material that has its properties somewhere in between those two values. By doing so, a good crystalline quality of the stiffening layer can be obtained and also a good quality epitaxial film can be realized in subsequent fabrication steps.

In addition, the stiffening layer may beneficially have a crystalline structure and a thermal expansion coefficient similar to that of an epitaxial film to be grown on the carrier substrate in a subsequent fabricating step. The stiffening layer could be made out of at least one of gallium nitride (GaN), aluminum nitride (AlN), indium nitride (InN), silicon germanium (SiGe), indium phosphite (InP), gallium arsenide (GaAs) or alloys made out of those materials. In addition, the alloys could include at least one of AlGaN, InGaN, InGaAs or AlGaAs. These materials are particularly of interest for electronic as well as opto-electronic applications, and can be arranged in the form of several layers within the stiffening layer.

In another advantageous implementation of the invention, a backside surface of the carrier substrate created after the detaching step has a surface roughness in a range of approximately 20 to about 200 Å RMS. The range may be between approximately 20–150 Å RMS, and more specifically in a range of approximately 20–100 Å RMS. Thus, even though the carrier substrate is separated from the remainder of the substrate, there will be sufficient friction between the carrier substrate and the remainder of the base substrate so that the position of the carrier substrate can be relatively well maintained. Therefore, it is possible to continue to process the structure in the same apparatus by growing the next layer. This could be another buffer layer or the final desired epitaxial layer, and it could be grown without having to handle the carrier substrate in a specific way, for example by securing it to a substrate holder.

In a preferred embodiment, an heteroepitaxial film is grown on the carrier substrate. The heteroepitaxial film may be made out of at least one of GaN, SiGe, AlN or InN.

Consequently, the present method which includes detaching the carrier substrate from the remainder of the base substrate solves the problems of the prior art. In cases where a commercially available base substrate is not compatible with the desired application of an epitaxial film to be grown, the present invention minimizes the incompatibility because the carrier substrate is independent from the remainder of the base substrate, and therefore is not affected by the undesirable properties. The influence of any sub-layer that may be present is also minimized.

With regard to the problems of crystallographic structure incompatibility between the base substrate and the desired epitaxial film, and also the differences in their thermal expansion coefficients, the creation of a carrier substrate according to the invention is also advantageous, because the stiffening layer provided on top of the base substrate is itself grown by a heteroepitaxial method. This means that by choosing the right material for the stiffening layer, which choice depends on the properties of the base material and the desired epitaxial film, any incompatibilities can be reduced. Furthermore, strain that might occur during the growth of the desired epitaxial layer on top of the carrier substrate can be absorbed to a large extent inside the carrier substrate. Thus, carrier substrates manufactured by the inventive process will serve to provide better quality epitaxial films.

FIGS. 1a–1h illustrate the process which includes using, for example, a SMART-CUT® transfer process production line.

FIG. 1a shows a base substrate which acts as the starting point for preparing a carrier substrate according to an embodiment of the present process. This substrate 1 has a front side 2 and a back side 3. For homo- or heteroepitaxial applications, the base substrate is made of a crystalline material, in particular a mono-crystalline type material. At least one surface, here the front side 2, is sufficiently well-defined to serve as a starting point for the growth of an epitaxial, homo- or heteroepitaxial layer or film. The surface is typically polished and prepared for epitaxy, substantially in accordance with typical crystalline directions. The exact size of the base substrate 1 is not of major importance, but at least the surface of the front side 2 should be sufficiently large enough to allow the growth of a sufficiently large carrier substrate suitable for the subsequent needs of devices to be fabricated. Particularly relevant are wafers made out of silicon, silicon carbide, sapphire, gallium arsenide, indium phosphide or germanium. These wafers are usually disc-shaped, but rectangular or square formats are also available. Disc-like wafers can have diameters of from 50.8 mm (2 inches) up to 300 mm, and even larger diameter wafers are foreseeable in the future.

FIG. 1b shows the result of the next processing step. In this embodiment, gaseous species, in particular hydrogen ions, are implanted through the front side 2 of the base substrate 1. The implanted species create a zone of weakness 4, which is essentially parallel to the front-side surface 2 of the base substrate 1. The depth 5 of the zone of weakness 4 can be adjusted by controlling the energy of the implanted species. For example, in the case of hydrogen atoms implanted into silicon carbide, an implantation energy of approximately 100 KeV creates a zone of weakness at a depth of approximately 6000 Å. The portion of material between the surface 2 and the zone of weakness 4 defines the sub-layer 6. It is particularly advantageous to utilize a SMART-CUT® process to achieve the ion implantation.

FIG. 1c shows the step of depositing a stiffening layer 6 on the base substrate. It should be noted that, at the beginning of the process, the base substrate 1 has been chosen so that its material composition will be compatible with epitaxially growing the stiffening layer 7. In particular, it should be compatible with heteroepitaxial growth.

In this first epitaxial growth step, the stiffening layer is grown to a thickness of approximately 1 to 10 micrometers. The thickness 8 of the stiffening layer 7 plus the thickness 5 of the sub-layer 6 must be sufficient to create a carrier substrate 10 that is free-standing, which means that the quality of the surface 9 of the stiffening layer 7 does not deteriorate at or after the point when the carrier substrate 10 is detached from the remainder of the base substrate 1. Typical stiffening layer materials are gallium nitride (GaN), aluminum nitride (AlN), indium nitride (InN), silicon germanium (SiGe), indium phosphite (InP), gallium arsenide (GaAs) or alloys made out of those materials, like AlGaN, InGaN, InGaAs, AlGaAs. However, in future applications it may be possible for other types of materials to play the role of a stiffening layer. Usually, the stiffening layer 7 can be applied by any deposition method leading to epitaxial growth. However, growth by molecular beam epitaxy (MBE), metal-organic chemical vapor (MOCVD), hydride vapor phase epitaxy (HVPE) or sputtering is particularly suitable.

FIG. 1d shows the result of the next processing step, which is the thermal treatment of the structure that has been created. This results in isolating the carrier substrate 10 from the remainder of the base substrate 11. The surface 12 does not deteriorate because the total thickness of the carrier substrate 10, being the sum of the thickness 5 and the thickness 8 (see FIG. 1c), is sufficient to prevent the formation of defects due to the morphology of the surface 12 opposite the zone 13 where the separation or fracture occurs. The surface 13 roughness where the fracture occurs is sufficient to securely hold the carrier substrate 10 in a position on top of the remainder of the substrate 11 due to frictional interaction. This can be advantageous for conducting subsequent processing steps, in particular when such subsequent processing steps are performed in the same apparatus without removing the carrier substrate 10. Typically, roughness values in the range of approximately 20–200 Å RMS, more specifically in a range of approximately 20–150 Å RMS and even more specifically in a range of approximately 20–100 Å RMS, can be achieved by using such a process.

Using an appropriate processing technique, different than the SMART-CUT® type process described earlier, it is possible to provoke a fracture to occur between the carrier substrate 10 and the base substrate 1 at the interface 2 between the stiffening layer 7 and the base substrate 1, as shown in FIG. 1d'. By doing so, the carrier substrate 10 is made entirely of the material of the stiffening layer 7. Depending on the process applied, the backside 16 of the stiffening layer 7, which is the carrier substrate 10 in this embodiment, may or may not need further polishing.

FIG. 1e shows the result of a subsequent processing step, which is the epitaxial growth of the desired material. A planned epitaxial film 14 is obtained during this second deposition step, which is conducted in a similar manner to the first one. Depending on the goal of the process, the material of the second film 14 can be the same as the material of the stiffening layer 7 of the carrier substrate 11. In the alternate, heteroepitaxial growth may occur, wherein the material of layer 14 is different from that of the stiffening layer 7. As the carrier substrate 10 is detached from the remainder of the base substrate 11, the crystalline quality of this second layer 14 is very good. Defects due to the stress can be minimized. Negative effects of the sub-layer 6 of the carrier substrate 10, which contains the material of the base substrate 1, can usually be ignored, as its thickness is usually chosen to be clearly thinner to that of the stiffening layer 7. This means that the carrier substrate 11 behaves like a bulk substrate of the material of the stiffening layer 7. This also means that the thickness of the second film 14, especially in cases where the material of layer 14 and that of layer 7 is the same, is not limited. It is even possible to grow a film 14 with a laterally variable thickness. The carrier substrate 10 does not impose limitations on the structure or thickness of the second layer 14. The process can be applied, for example, to grow mono-crystals of excellent quality, especially where the material of layers 14 and 7 are the same or heterostructures can be built, leading to devices like laser diodes.

In an optional processing step (not shown), the sub-layer 6 can be removed, for example by using a dry or wet etch technique. In addition, the remainder 11 of the base substrate 1 can be polished, in particular by chemical-mechanical polishing (CMP), and can be re-used as a base substrate 1 in a subsequent carrier substrate 10 manufacturing process.

FIGS. 1f to 1h show a variant of the process described above. With respect to the first embodiment of FIGS. 1a to 1e, these processing steps fit replace the processing step shown in FIG. 1b. In particular, FIG. 1f shows the result of depositing a sacrificial layer 15 on top of the base substrate 1. This sacrificial layer 15 is, for example, made out of silicon dioxide and may be deposited according to one of the usual methods known in the art. This sacrificial layer protects the front side 2 of the base substrate 1 from organic and particle contamination which might occur during the subsequent ion implantation process step.

FIG. 1g shows the result of the ion implantation step. It is comparable to the process step described in combination with FIG. 1b. However, due to the presence of the sacrificial layer 15 the depth 5 of the weakened zone 4 is smaller than that of the first embodiment. This occurs because implantation is at the same energy level and the gaseous species now have to travel through the sacrificial layer as well. As a consequence, the gaseous species stop at a depth 5 in the base substrate which is less than that of the first embodiment.

FIG. 1h shows the result of removal of the sacrificial layer. After the ion implantation, the sacrificial layer 15 is removed in order to achieve a clean front side 2 surface of the base substrate 1. The next step is the growth of the stiffening layer which is comparable to what has been described above with respect to FIG. 1c.

Several further alternative processes or treatments lead to different embodiments. They are not shown in the figures, but will be briefly explained below.

In order to further improve the quality of the stiffening layer 7 as well as the second epitaxial layer 14, further steps can be conducted. For example, prior to applying the stiffening layer, the front side surface 2 can be prepared in order to facilitate the nucleation of the epitaxial stiffening layer. Chemical etching using hydrofluoric acid (HF), plasma etching, standard cleaning one (SC1) with standard cleaning two (SC2), or any other suitable cleaning technique may be used to prepare the front side surface 2. It is also possible to use a thermal oxidation technique and oxide removal before implanting ions in order to remove surface defects from the base substrate.

It is also possible to use at least one additional layer as a buffer layer in order to improve the quality of the stiffening layer. Such additional layers grown on the substrate 1 relieve any stress that might occur inside the stiffening layer. Typical materials that could be utilized are aluminum nitride, gallium nitride, aluminum gallium nitride or a combination thereof. Sophisticated buffer techniques, like lateral overgrowth or the like, can also be applied. The same kind of additional layers can also be applied between the carrier substrate 10 and the desired epitaxial layer 14. It is also possible to grow the additional layers before and/or after the implantation step. In a further variant, the implanting step results in placing the weakened zone inside one of the additional layers, wherein the additional layers were grown prior to implantation.

In a preferred implementation, at least process steps 1c to 1e take place in one apparatus without moving the carrier substrate 10, thus reducing the risks of introducing contamination or scratches on the carrier substrate. Alternatively, if it is advantageous for a particular planned epitaxial film process, it is possible to separate the carrier substrate 10 from the remainder of the substrate 11 after step 1d. In this case, the carrier substrate must be sufficiently thick for it to be handled and moved from one apparatus to another.

Epitaxial films 14 that can be obtained by utilizing the present methods are in particular films made out of gallium nitride, silicon germanium, aluminum nitride or indium nitride. An example of the fabrication of an epitaxial gallium nitride film on a silicon carbide base substrate is described below.

In an example, a base substrate is provided of a mono-crystalline silicon carbide of a 6H or 4H polytype with silicon terminated surface, or 3C (three cubic) silicon carbide. Alternatively, the process could also be applied to a base substrate made out of sapphire. Hydrogen ions are implanted through the front side surface 2 of the base substrate 1 with a dose between 2 and $8 \times 10^{16}$ H+/cm$^2$ with an energy between 30 and 210 KeV. In particular, a dose of $5 \times 10^{16}$ H+/cm$^2$ with an energy of 120 KeV may be used. As described above, a sacrificial layer 15 can be used to prevent contamination. In the case of silicon carbide it is possible to grow a silicon dioxide layer that is a few hundred Å thick by using a thermal process. After implantation, the silicon dioxide can be removed by using hydrofluoric acid (HF), for example, in a ten percent concentration. A 20 minute period of time is usually sufficient to remove the oxide layer.

In the next step, gallium nitride is deposited on the implanted silicon carbide base substrate by means of MBE at a temperature of less than 800° C. This first epitaxial layer corresponds to the stiffening layer 7 and has a thickness of some microns. Alternatively, prior to depositing gallium nitride, a buffer layer could be provided. Another alternative is to clean the surface prior to deposition by chemical etching by using hydrofluoric acid, or by plasma etching, or by utilizing a SC1 with SC2 cleaning technique.

The sample is next heated to a temperature of 900° C. or more, and a fracture between the carrier substrate 10 and the remainder of the silicon carbide base substrate 11 occurs. Then a second epitaxial growth step occurs, wherein gallium nitride is grown to a thickness of up to about 200–300 micrometers, whereby the growth speed can be relatively high, for example, 50 μm per hour.

Finally, the substrate and the newly grown gallium nitride layer cool back to room temperature, and it is possible to separate the gallium nitride film from the substrate. Using chemical means, the back side of the gallium nitride can be cleaned, to remove any remaining silicon carbide. The original silicon carbide base substrate will be recycled by polishing its surface, for example, by using chemical-mechanical polishing.

What is claimed is:

1. A method of fabricating a substrate comprising:
providing a crystalline base substrate that includes a front face and a zone of weakness which cooperatively define a carrier sublayer therebetween, wherein the zone of weakness defines a remainder of the base substrate on an opposite side of the zone of weakness from the carrier sublayer;
growing a stiffening layer on the front face of the base substrate to form a carrier substrate for subsequent processing;
detaching the stiffening layer and carrier sublayer from the remainder of the base substrate at the zone of weakness to obtain a carrier substrate that is suitable for use in growing high quality homo-epitaxial or hetero-epitaxial films thereon; and
growing a high quality homo-epitaxial film or hetero-epitaxial film on the stiffening layer of the carrier substrate.

2. The method of claim 1 which further comprises implanting atomic species into the base substrate to a controlled mean implantation depth to form the zone of weakness within the base substrate that defines the sublayer.

3. The method of claim 1 wherein the sub-layer is less than approximately 5 µm thick.

4. The method of claim 1 which further comprises conducting a thermal treatment to detach the carrier substrate from the base substrate.

5. The method of claim 2 which further comprises providing a sacrificial layer on the front face of the base substrate prior to implanting atomic species.

6. The method of claim 5 wherein the sacrificial layer is a silicon dioxide ($SiO_2$) layer.

7. The method of claim 5 which further comprises removing the sacrificial layer before providing the stiffening layer.

8. The method of claim 1 which further comprises growing the stiffening layer by at least one of epitaxial growth, molecular beam epitaxy (MBE), metal-organic chemical vapor deposition (MOCVD), hydride vapor phase epitaxy (HVPE) or by sputtering.

9. The method of claim 1 wherein the stiffening layer has a thickness of approximately 1 µm to at least approximately 10 µm.

10. The method of claim 1 which further comprises pre-treating the front face of the base substrate prior to growing the stiffening layer by using at least one of HF etching, plasma etching, or a standard cleaning treatment.

11. The method of claim 1 which further comprises providing at least one additional layer on top of the stiffening layer or between the base substrate and the stiffening layer.

12. The method of claim 11 wherein the additional layer between the base substrate and the stiffening layer is a buffer layer, the buffer layer being made of at least one of AlN, GaN, AlGaN and a combination thereof.

13. The method of claim 2 further comprising providing at least two additional layers on top of the base substrate, and wherein at least one of the additional layers is provided prior to implanting atomic species.

14. The method of claim 13 which further comprises implanting the atomic species into the at least one additional layer to create a weakened zone inside the at least one additional layer.

15. The method of claim 1 which further comprises polishing a surface of the remainder of the base substrate after detaching the carrier substrate such that the base substrate is suitable for reuse.

16. The method of claim 1 wherein the base substrate is made of at least one of silicon, silicon carbide, sapphire, gallium arsenide, indium phosphide (InP) or germanium (Ge).

17. The method of claim 1 wherein the stiffening layer is epitaxially grown and is made of the same material as the homo-epitaxial film that is to be grown on the carrier substrate in a subsequent fabricating step.

18. The method of claim 1 wherein the stiffening layer has a crystalline structure and a thermal expansion coefficient similar to that of the epitaxial film to be grown on the carrier substrate in a subsequent fabricating step.

19. The method of claim 1 wherein the stiffening layer is made out of at least one of gallium nitride (GaN), aluminum nitride (AlN), indium nitride (InN), silicon germanium (SiGe), indium phosphite (InP), gallium arsenide (GaAs) or alloys made out of those materials.

20. The method of claim 19 wherein the alloys include at least one of AlGaN, InGaN, InGaAs or AlGaAs.

21. The method of claim 1 wherein a surface of the carrier substrate has a surface roughness in a range of approximately 20 Å RMS to about 200 Å RMS.

22. The method of claim 1, wherein a hetero-epitaxial film made out of at least one of GaN, SiGe, AlN, or InN is grown on the stiffening layer.

23. The method of claim 1 wherein all recited steps are conducted in the same apparatus.

24. The method of claim 1 wherein the detaching provides a surface roughness that is sufficient to securely hold the carrier substrate in position on the remainder of the base substrate due to frictional interaction.

25. The method of claim 24, wherein the carrier substrate is retained in position against the remainder of the base substrate during the growth of the high quality epitaxial film.

26. The method of claim 1, wherein the crystalline base substrate is monocrystalline.

27. A method of fabricating a substrate comprising:
providing a crystalline base substrate;
forming a zone of weakness in the base substrate for defining a carrier sublayer and a remainder of the base substrate;
growing a stiffening layer on the base substrate after forming the zone of weakness;
detaching the stiffening layer and carrier sublayer from the remainder of the base substrate at the zone of weakness to obtain a carrier substrate; and
growing one of a homo-epitaxial layer and a hetero-epitaxial layer on the stiffening layer of the carrier substrate.

28. The method of claim 26, wherein the stiffening layer has a thickness of approximately 1 µm to approximately 10 µm.

* * * * *